(12) United States Patent
En et al.

(10) Patent No.: US 6,563,183 B1
(45) Date of Patent: May 13, 2003

(54) GATE ARRAY WITH MULTIPLE DIELECTRIC PROPERTIES AND METHOD FOR FORMING SAME

(75) Inventors: William G. En, Milpitas, CA (US); Arvind Halliyal, Cupertino, CA (US); Minh-Ren Lin, Cupertino, CA (US); Minh Van Ngo, Fremont, CA (US); Cyrus E. Tabery, Cupertino, CA (US); Chih-Yuh Yang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/085,949

(22) Filed: Feb. 28, 2002

Related U.S. Application Data (60) Provisional application No. 60/345,821, filed on Dec. 31, 2001.

(51) Int. Cl.[7] .......................... H01L 29/76; H01L 29/94; H01L 31/061; H01L 31/113; H01L 31/119
(52) U.S. Cl. ...................... 257/410; 438/216; 438/261; 257/310
(58) Field of Search .................. 257/321–325, 257/310, 410; 438/240, 261, 216

(56) References Cited

U.S. PATENT DOCUMENTS

| | | | | |
|---|---|---|---|---|
| 4,558,407 A | * | 12/1985 | Sterner | 363/132 |
| 4,590,663 A | * | 5/1986 | Haken | 257/336 |
| 6,015,739 A | * | 1/2000 | Gardner et al. | 438/287 |
| 6,060,755 A | * | 5/2000 | Ma et al. | 257/410 |
| 6,207,589 B1 | * | 3/2001 | Ma et al. | 438/785 |
| 6,238,977 B1 | * | 5/2001 | Sung | 257/316 |
| 6,255,669 B1 | | 7/2001 | Birkhahn et al. | |
| 6,268,251 B1 | * | 7/2001 | Zhong et al. | 438/275 |
| 6,297,539 B1 | * | 10/2001 | Ma et al. | 257/410 |
| 6,368,907 B1 | * | 4/2002 | Doi et al. | 438/217 |
| 2001/0013629 A1 | * | 8/2001 | Bai | 257/411 |
| 2001/0032995 A1 | * | 10/2001 | Maria et al. | 257/310 |
| 2002/0135030 A1 | * | 9/2002 | Horikawa | 257/405 |

* cited by examiner

*Primary Examiner*—Ngân V. Ngô
*Assistant Examiner*—Thao X. Le
(74) *Attorney, Agent, or Firm*—Renner, Otto, Boisselle & Sklar, LLP (57) ABSTRACT

The invention provides an integrated circuit fabricated on a semiconductor substrate. The integrated circuit comprises a first field effect transistor and a second field effect transistor. The first field effect transistor comprises a first polysilicon gate positioned above a first channel region of the substrate and isolated from the first channel region by a first dielectric layer extending the entire length of the first polysilicon gate. The first dielectric layer comprises a first dielectric material with a first dielectric constant. The second field effect transistor comprises a second polysilicon gate positioned above a second channel region on the substrate and isolated from the second channel region by a second dielectric layer extending the entire length of the second polysilicon gate. The second dielectric layer comprises a second dielectric material with a second dielectric constant. The first dielectric constant and the second dielectric constant may be different and both may be greater than the dielectric constant of silicon dioxide.

4 Claims, 8 Drawing Sheets

GATE ARRAY WITH MULTIPLE DIELECTRIC PROPERTIES AND METHOD FOR FORMING SAME

This application claims the benefit of Provisional Application No. 60/345,821, filed Dec. 31, 2001.

TECHNICAL FIELD

The present invention relates to methods for fabricating an array of field effect transistors on a semiconductor substrate, and more particularly for fabricating an array wherein each gate has a the gate dielectric with dielectric properties independent of other gates in the array.

BACKGROUND OF THE INVENTION

Integrated circuits typically utilize an array of field effect transistors, each of which comprises a polysilicon gate positioned over a channel region within a silicon substrate. An insulating layer, typically called a gate oxide, separates the polysilicon gate from the channel region.

The typical process for fabricating a polysilicon gate is to first grow an oxide on the surface of a substrate followed by applying a polysilicon layer. An anti-reflective coating and a photoresist layer are then deposited over the polysilicon layer, patterned, and-developed to mask the polysilicon gate. An anisotropic etch is then used to remove the un-masked polysilicon such that the polysilicon gate is formed.

It is a generally recognized goal to decrease the size of the polysilicon gate. Decreasing the gate size permits decreasing the size of each individual silicon device. Decreasing the size of each device provides the ability to increase the density of the transistor array fabricated on the substrate which provides the ability to fabricate a more complex circuit on a substrate of a given size. Additionally, a smaller channel region beneath a smaller gate reduces capacitance across the channel/source junction and the channel drain junction which provides for faster operating speed and reduced power consumption.

Reducing the gate size requires reducing the thickness of the gate oxide to maintain adequate capacitive coupling between the gate and the channel region. Further, there exists a minimum physical thickness of the gate oxide at which the oxide no longer isolates the gate from the channel region. Therefore, there exists a minimum gate size that can be achieved when silicon dioxide is used as the gate oxide. Therefore, it has been proposed to use other dielectrics with dielectric constants greater than the dielectric constant of silicon dioxide (e.g high K dielectrics) in the dielectric layer to replace silicon dioxide such that capacitive coupling is improved (e.g. smaller electrical thickness) while a larger physical thickness is maintained. With the use of high K dielectrics, very small transistor structures and dense transistor arrays can be fabricated. It is envisioned that such complex circuits will require the use of transistors with different operating properties.

Accordingly there is a strong need in the art for an integrated circuit with an array of transistors wherein each transistor may be fabricated with a gate dielectric that includes dielectric properties independent of dielectric properties of adjacent transistors.

SUMMARY OF THE INVENTION

A first aspect of the present invention is to provide an integrated circuit fabricated on a semiconductor substrate. The integrated circuit comprises a first field effect transistor and a second field effect transistor.

The first field effect transistor comprises a first polysilicon gate positioned above a first channel region of the substrate and isolated from the first channel region by a first dielectric layer extending the entire length of the first polysilicon gate. The first dielectric layer comprises a first dielectric material with a first dielectric constant.

The second field effect transistor comprises a second polysilicon gate positioned above a second channel region on the substrate and isolated from the second channel region by a second dielectric layer extending the entire length of the second polysilicon gate. The second dielectric layer comprises a second dielectric material with a second dielectric constant. The first dielectric constant and the second dielectric constant may be different and both may be greater than the dielectric constant of silicon dioxide.

In one embodiment, the second dielectric layer may itself comprise multiple layers. As such, the second dielectric layer may comprise a third dielectric layer adjacent to the second dielectric layer (and adjacent to either the second polysilicon gate or adjacent to the substrate) extending the entire length of the second polysilicon gate. The third dielectric layer may comprise a third dielectric material which may, or may not, be the same as the first dielectric material.

The thickness of the first dielectric layer and the second dielectric layer (as measured between the substrate and the polysilicon gate) may or may not be the same. Further, the thickness of the first polysilicon gate and the second polysilicon gate may or may not be the same.

A second aspect of the present invention is to provide a method of fabricating an integrated circuit on a semiconductor substrate. The method comprises: a) depositing a first high K dielectric on the substrate; b) fabricating a mask on the surface of the first high K dielectric to mask a first portion and to expose a second portion; c) removing the first high K dielectric to expose the substrate in the second portion; d) depositing a second high K dielectric on the substrate in the second portion; e) depositing a polysilicon layer over the first portion and the second portion; f) fabricating a mask on the surface of the polysilicon layer to mask a first gate in the first portion and to mask a second gate in the second portion; and g) etching the polysilicon layer, the first high K dielectric and the second high K dielectric to form the first gate and the second gate.

The step of depositing the second high K dielectric on the substrate in the second portion may comprise depositing the second high K dielectric over the entire surface including the substrate in the second portion and at least one of the mask and the first high K dielectric in the first portion. Thereafter, the wafer may be polished to expose the first high K dielectric in the first portion.

A third aspect of the present invention is to provide an alternative method of fabricating an integrated circuit on a semiconductor substrate. The alternative method comprises: a) depositing a first high K dielectric on the substrate; b) fabricating a mask on the surface of the first high K dielectric to mask a first portion and to expose a second portion; c) altering the dielectric properties of the first high K dielectric in the second portion; d) depositing a polysilicon layer over the first portion and the second portion; e) fabricating a mask on the surface of the polysilicon layer to mask a first gate in the first portion and to mask a second gate in the second portion; and f) etching the polysilicon layer, the first high K dielectric, and the second high K dielectric to form the first gate and the second gate.

The step of altering the dielectric property of the first high K dielectric may comprise implanting the first high K dielectric with at least one of $N^+$, $Hf^+$, $Al^+$, and $Zr^+$. Alternatively, the step of altering the dielectric property of the first high K dielectric may comprise subjecting the first high K dielectric to a plasma environment to modify the work function of the first high K dielectric.

A fourth aspect of the present invention is to provide yet another alternative method of fabricating an integrated circuit on a semiconductor substrate. The method comprising: a) depositing a first high K dielectric on the substrate; b) fabricating a mask on the surface of the first high K dielectric to mask a first portion and to expose a second portion; c) removing the first high K dielectric to expose the substrate in the second portion; d) altering the dielectric properties of the first high K dielectric in the second portion; e) depositing a second high K dielectric on the substrate in the second portion; f) depositing a polysilicon layer over the first portion and the second portion; g) fabricating a mask on the surface of the polysilicon layer to mask a first gate in the first portion and to mask a second gate in the second portion; and h) etching the polysilicon layer, the first high K dielectric, and the second high K dielectric to form the first gate and the second gate.

Again, the step of altering the dielectric property of the first high K dielectric may comprise implanting the first high K dielectric with at least one of $N^+$, $Hf^+$, $Al^+$, and $Zr^+$. Alternatively, the step of altering the dielectric property of the first high K dielectric may comprise subjecting the first high K dielectric to a plasma environment to modify the work function of the first high K dielectric.

For a better understanding of the present invention, together with other and further aspects thereof, reference is made to the following description, taken in conjunction with the accompanying drawings, and its scope will be pointed out in the appended clams.

DESCRIPTION OF THE PREFERRED EMBODIMENTS

The present invention will now be described in detail with reference to the drawings. The diagrams are not drawn to scale for the purpose of showing clarity.

Figure 1:
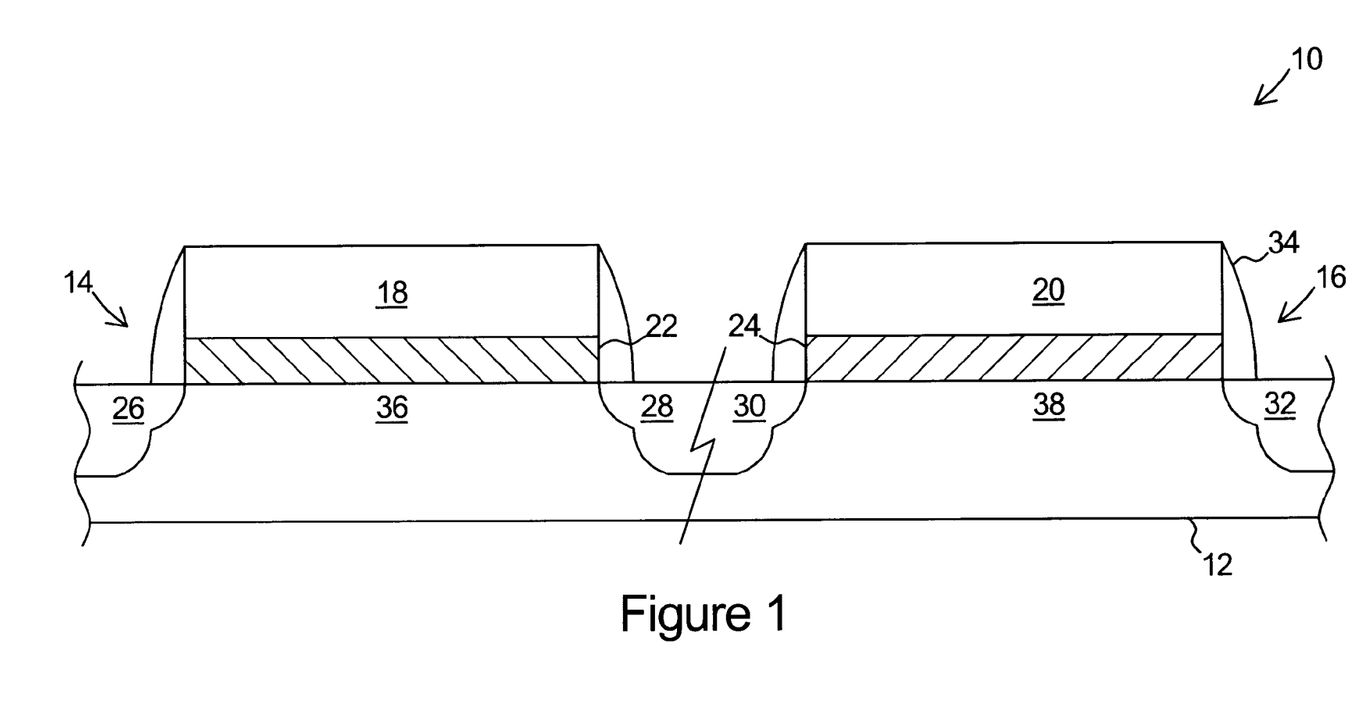
FIG. 1 is a schematic cross sectional view of an integrated circuit in accordance with one embodiment of the present invention.

Turning to FIG. 1, an integrated circuit 10 is shown. The integrated circuit 10 includes two field effect transistors 14 and 16 fabricated on a semiconductor substrate 12. Each field effect transistor 14 and 16 comprises a semiconductor gate 18 and 20 respectively positioned horizontally over a channel region 36 and 38 within the substrate 12. A source region 26 and 30 and a drain region 28 and 32 are positioned within the substrate 12 adjacent the channel region 36 and 38 respectively and define a length of the channel region 36 and 38 respectively. Because each semiconductor gate 18 and 20 is typically used for masking each channel region 36 and 38 when implanting each source regions 26 and 30 and each drain region 28 and 32, the length of each channel region 36 and 38 is approximately the same length as the length of the semiconductor gate 18 and 20 that masks such channel region 36 and 38.

A first dielectric layer 22 isolates the gate 18 from the channel region 36 and a second dielectric layer 24 isolates the gate 20 from the channel region 38. The first dielectric layer 22 laterally extends the entire length of the gate 18 and has a physical thickness (separation distance between the channel region 36 and the gate 18) adequate to prevent charge from migrating (e.g. charge tunneling or charge injection) between the channel region 36 and the gate 18. The first dielectric layer 22 comprises at least one horizontal layer of a dielectric material with a dielectric constant greater than that of silicon dioxide (e.g. high K dielectric material) such that the gate 18 and the channel region 36 capacitively couple through the first dielectric layer 22 as required for operation of field effect transistor 14. The strength of the capacitive coupling required for operation of the field effect transistor 14 is a function of the operating speed and voltage of the field effect transistor 14 as well as the physical dimensions and material properties of the gate 18 and the channel region 36.

Similarly, the second dielectric layer 24 laterally extends the entire length of the gate 20 and has a physical thickness adequate to prevent charge from migrating between the channel region 38 and the gate 20. The physical thickness of the second dielectric layer 24 may be different than the physical thickness of the first dielectric layer 22. The second dielectric layer 24 comprises at least one horizontal layer comprising a high K dielectric material such that the gate 20 and the channel region 38 capacitively couple through the second dielectric layer 24 as required for operation of field effect transistor 14. Again, the strength of the capacitive coupling required for operation of the field effect transistor 16 is a function of the operating speed and voltage of the field effect transistor 16 as well as the physical dimensions and material properties of the gate 20 and the channel region 38. The material comprising the second dielectric layer 24 may be different than the material comprising the first dielectric layer 22 in an embodiment wherein each of the first dielectric layer 22 and the second dielectric layer 24 comprise only a single homogenous material. The material comprising at least one horizontal layer of the second dielectric layer 24 may be different than at least one horizontal layer of the first dielectric layer 22 in an embodiment wherein at least one of the first dielectric layer 22 and the second dielectric layer 24 comprise multiple horizontal layers of dielectric materials.

Figure 2:
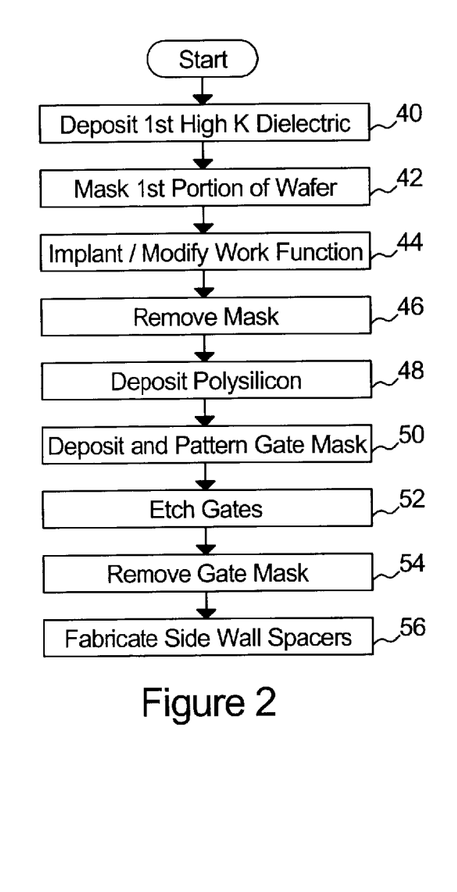
FIG. 2 is a flow chart representing a method of fabricating an integrated circuit in accordance with one embodiment of the present invention.
Figure 5A:
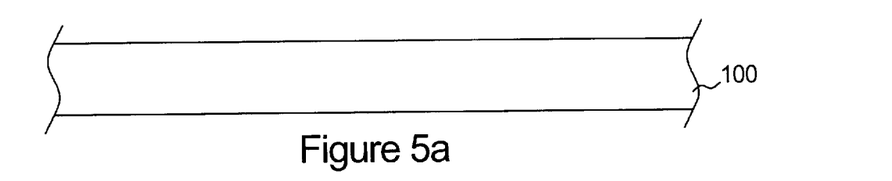
FIG. 5a is a cross sectional view of one processing step in the fabrication of the integrated circuit in accordance with the method of the flowchart of FIG. 2.
Figure 5B:
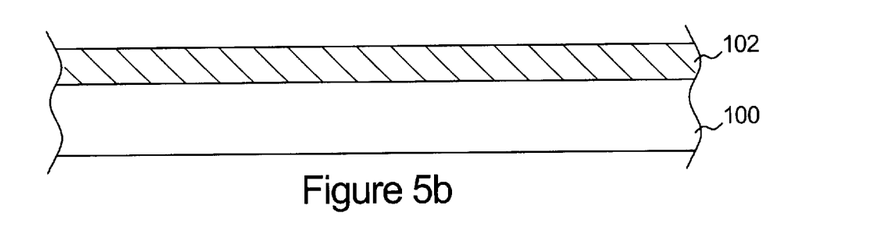
FIG. 5b is a cross sectional view of one processing step in the fabrication of the integrated circuit in accordance with the method of the flowchart of FIG. 2.

Turning to FIG. 2 in conjunction with the cross section diagrams of FIGS. 5a through 5i, an exemplary process for fabricating the integrated circuit in accordance with this invention is shown. FIG. 5a shows an exemplary semiconductor substrate 100 such as monocrystaline silicon. The monocrystaline silicon substrate 100 may be lightly doped either p-type or n-type. Step 40 40o represents depositing a first high K dielectric layer 102 on the surface of the substrate 100 as is shown in FIG. 5b. In the exemplary embodiment, the first high K dielectric layer 102 may comprise a material selected from the group of $TiO_2$, $Y_2O_3$, $Ta_2O_5$, $La_2O_3$, or their silicates or aluminates, $BaTiO_3$, $SrTiO_3$, BST (($Ba,Sr)TiO_3$), $PbTiO_3$, PZT, $HfO_2$, $ZrO_2$, $CeO_2$, $Al_2O_3$, $TiO_2$, $Y_2O_3$, and other binary and tertiary metal oxides and ferroelectric material having a dielectric constant greater than 20. The first high K dielectric layer 102 may be deposited on the substrate 100 using a low pressure chemical vapor deposition process. Because some of the high K materials in the group listed above may form an incompatible boundary with crystalline silicon, a barrier interface layer may be formed below the high-K dielectric layer 102 to provide a buffer interface between the high K material and the silicon substrate 100. The buffer interface layer may be silicon dioxide having a thickness of about 0.5 nm to about 0.7 nm and may be deposited on the surface of the silicon substrate 100 prior to the high K dielectric layer 102 using low temperature thermal oxidation, a remote plasma deposition process, an atomic layer deposition process, or a similar process for fabricating silicon dioxide on silicon to an approximate thickness of 0.5 nm–0.7 nm.

Figure 5C:
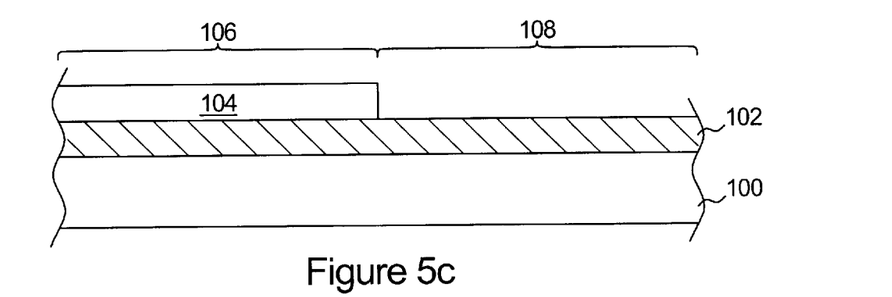
FIG. 5c is a cross sectional view of one processing step in the fabrication of the integrated circuit in accordance with the method of the flowchart of FIG. 2.

Step 42 represents fabricating a mask 104 over a first portion 106 of the first high K dielectric layer 102. The mask may be a photoresist masked fabricating using typical lithography techniques which may include depositing photoresist across the entire surface of the first high K dielectric layer 102 followed by patterning the photoresist using coherent UV illumination and developing the photoresist to wash away the photoresist over a second portion 108 of the first high K dielectric layer 102 while leaving the mask 104 over the first portion 106. Again, if an incompatibility exist between the high K dielectric material and the photoresist or if the interface between the photoresist and the high K dielectric reflects illumination at the UV lithography wavelength, an anti reflective barrier material may be deposited over the first high K dielectric layer 102 prior to depositing the photoresist and fabricating the mask 104.

Figure 5D:
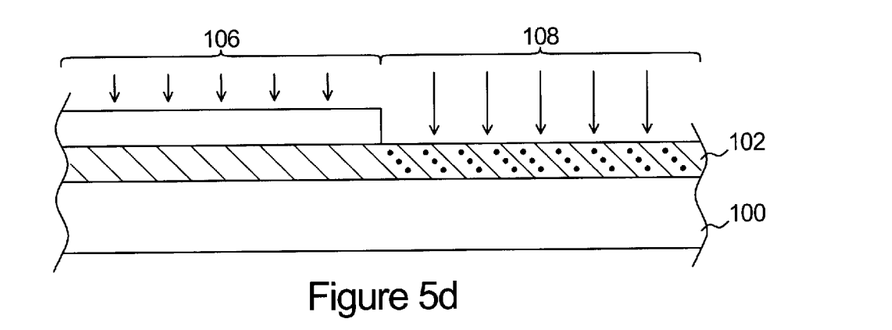
FIG. 5d is a cross sectional view of one processing step in the fabrication of the integrated circuit in accordance with the method of the flowchart of FIG. 2.
Figure 5E:
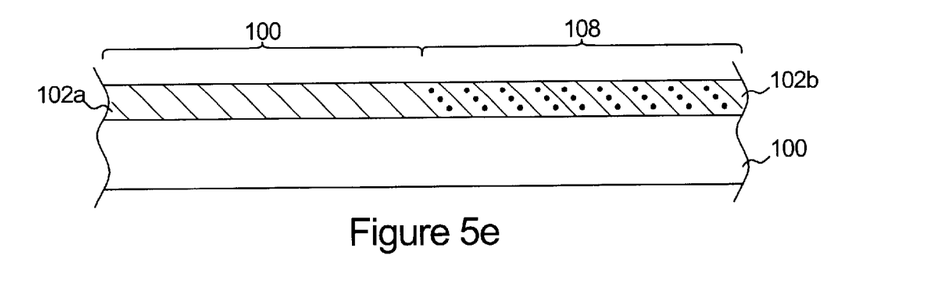
FIG. 5e is a cross sectional view of one processing step in the fabrication of the integrated circuit in accordance with the method of the flowchart of FIG. 2.

Step 44 represents modifying the dielectric properties of the first high K dielectric layer 102 in the second portion 108 as is shown in FIG. 5d. Step 44 may include exposing the second portion 108 of the high K dielectric layer 102 to a plasma environment to modify the work function of the high K dielectric material. Alternatively, step 44 may represent implanting the exposed high K dielectric material with at least one of $N^+$, $Hf^+$, $Al^+$, and $Zr^+$. In either embodiment, the mask 106 prevents modification of the high K dielectric material in the first portion 106.

Step 46 represents removing the photoresist mask 104 leaving both of the first portion 106 and the second portion 108 of the high K dielectric layer 102 exposed. It should be appreciated that after the modification of the dielectric layer 102 in the first portion at step 44, the first portion no longer has the same dielectric properties as the second portion. As such in FIG. 5e, the first portion is referred to as the first dielectric layer 102a and the second portion is referred to as the second dielectric layer 102b.

Figure 5F:
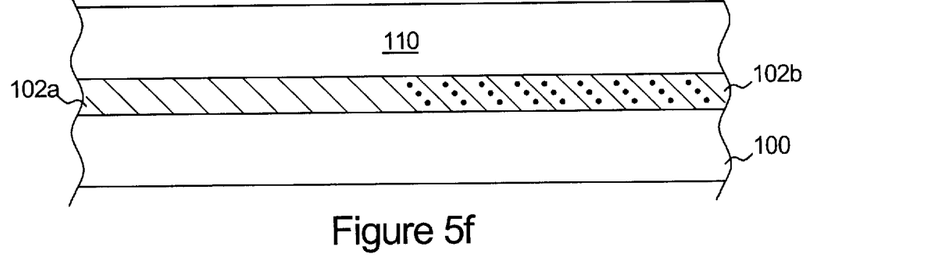
FIG. 5f is a cross sectional view of one processing step in the fabrication of the integrated circuit in accordance with the method of the flowchart of FIG. 2.

Step 48 represents depositing a layer of semiconductor material 110 across both the first dielectric layer 102a and the second dielectric layer 102b. The layer of semiconductor material 110 may be polysilicon. Again, because incompatibility may exist between either the material of the first dielectric layer 102a and polysilicon or the material of the second dielectric layer 102b and polysilicon, a barrier interface layer may be deposited on the surface of both the first dielectric layer 102a and the second dielectric layer 102b prior to depositing the polysilicon.

Figure 5G:
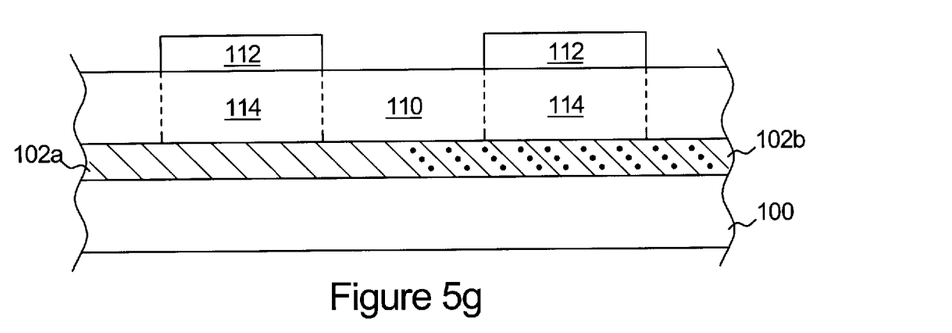
FIG. 5g is a cross sectional view of one processing step in the fabrication of the integrated circuit in accordance with the method of the flowchart of FIG. 2.

Step 50 represents depositing and patterning a gate mask 112 on the surface of the polysilicon layer 110. Again, the mask may be a photoresist mask fabricating using typical lithography techniques which may include depositing an antireflective coating such as nitride across the entire surface of the polysilicon layer 110 followed by depositing a layer of photoresist across the entire surface of the anti reflective coating. The photoresist may then be patterned using coherent UV illumination and developing the photoresist to harden the photoresist mask 112 in gate regions 114 while washing away the photoresist over other regions.

Figure 5H:
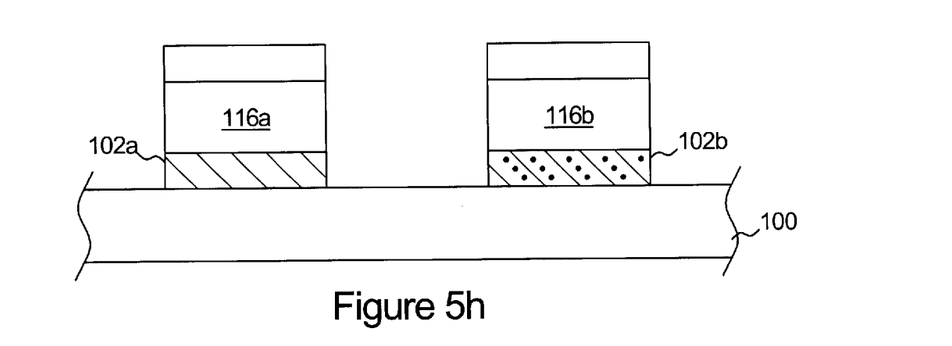
FIG. 5h is a cross sectional view of one processing step in the fabrication of the integrated circuit in accordance with the method of the flowchart of FIG. 2.

Step 52 represents etching the polysilicon and the dielectric layers 102a and 102b to form the transistor gates 116a and 116b over the first dielectric layer 102a and the second dielectric layer 102b respectively as is shown in FIG. 5h. Etching of the polysilicon may include an ion bombardment etch using HBr, $CF_4$, $CL_2$ in combination with $HeO_2$ to increase the selectivity between the polysilicon and the high K materials. Increasing selectivity between the polysilicon and the high K material enables the polysilicon etch to be performed with an increased bias power and a reduced pressure which improves the vertical side wall tolerance of the gate profile. Etching of the high K dielectrics may be performed using an etch chemistry of HBr, He, or $CF_4$ in the environment which is selective between the high K material and polysilicon. As such, the etching of the high K dielectrics does not significantly effect the sidewall profile of the gates 116a and 116b and does not significantly penetrate into the polysilicon substrate 100.

Figure 5I:
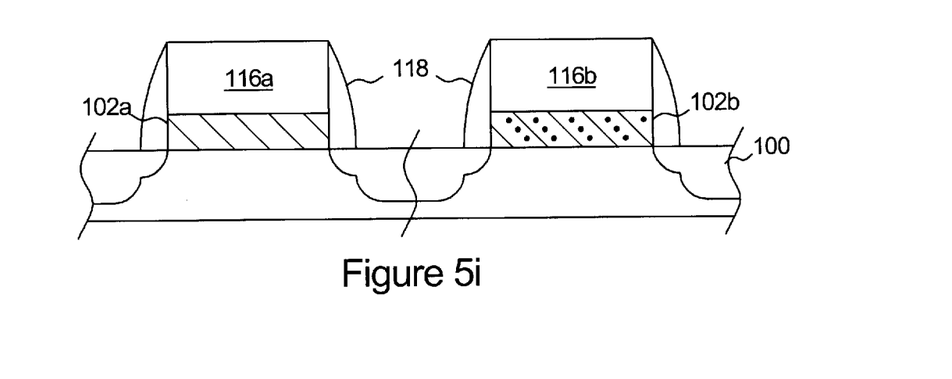
FIG. 5i is a cross sectional view of one processing step in the fabrication of the integrated circuit in accordance with the method of the flowchart of FIG. 2.

Step 54 represents removing the gate mask and step 56 represents implanting the source and drain and fabricating insulating side wall spacers 118 as is shown in FIG. 5i.

Figure 3:
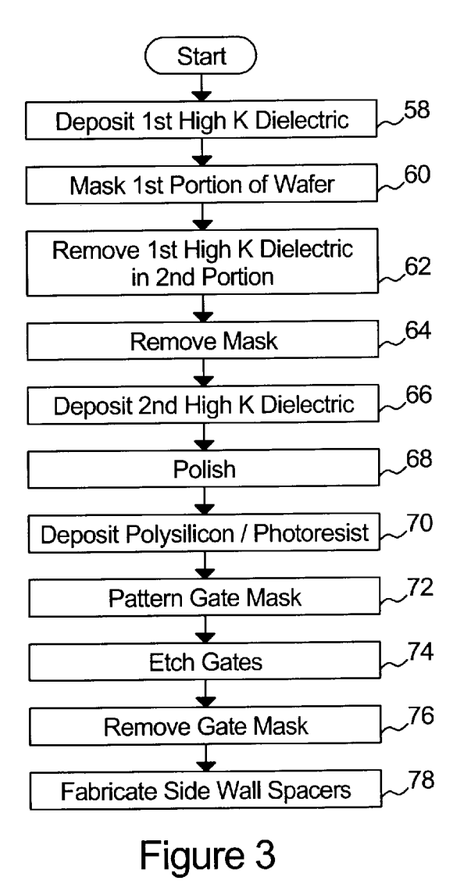
FIG. 3 is a flow chart representing a method of fabricating an integrated circuit in accordance with one embodiment of the present invention.

Turning to the flowchart of FIG. 3 in conjunction with the cross section diagrams of FIGS. 6a through 6h, a second process for fabrication of an integrated circuit in accordance with the present invention is shown.

Figure 6A:
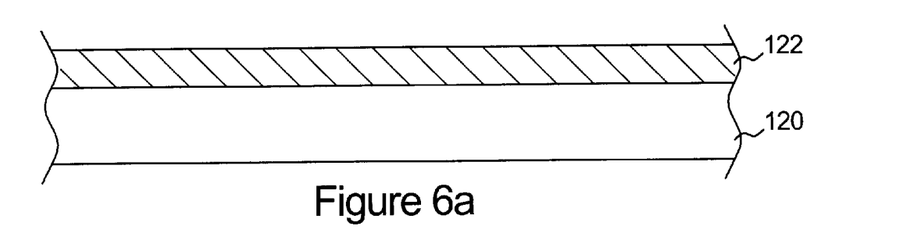
FIG. 6a is a cross sectional view of one processing step in the fabrication of the integrated circuit in accordance with the method of the flowchart of FIG. 3.

Step 58 represents depositing a first high K dielectric layer 122 on the surface of a substrate 120 as is shown in FIG. 6a. In the exemplary embodiment, the first high K dielectric layer 122 may comprise a material selected from the group of $TiO_2$, $Y_2O_3$, $Ta_2O_5$, $La_2O_3$, or their silicates or aluminates, $BaTiO_3$, $SrTiO_3$, BST $((Ba,Sr)TiO_3)$, $PbTiO_3$, PZT, $HfO_2$, $ZrO_2$, $CeO_2$, $Al_2O_3$, $TiO_2$, $Y_2O_3$, and other binary and tertiary metal oxides and ferroelectric material having a dielectric constant greater than 20. The first high K dielectric layer 122 may be deposited on the substrate 120 using a low pressure chemical vapor deposition process. Again, because some of the high K materials in the group listed above may form an incompatible boundary with crystalline silicon, a barrier interface layer may be formed below the high-K dielectric layer 122 to provide a buffer interface between the high K material and the silicon substrate 120. The buffer interface layer may be silicon dioxide having a thickness of about 0.5 nm to about 0.7 nm and may be deposited on the surface of the silicon substrate 120 prior to the high K dielectric layer 122 using low temperature thermal oxidation, a remote plasma deposition process, an atomic layer deposition process, or a similar process for fabricating silicon dioxide.

Figure 6B:
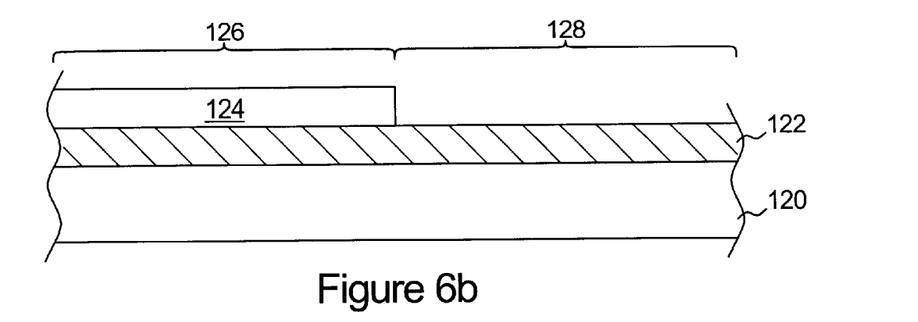
FIG. 6b is a cross sectional view of one processing step in the fabrication of the integrated circuit in accordance with the method of the flowchart of FIG. 3.

Step 60 represents fabricating a mask 124 over a first portion 126 of the first high K dielectric layer 122. The mask may be a photoresist masked fabricating using typical lithography techniques which may include depositing photoresist across the entire surface of the first high K dielectric layer 122 followed by patterning the photoresist using coherent UV illumination and developing the photoresist to wash away the photoresist over a second portion 128 of the first high K dielectric layer 122 while leaving the mask 124 over the first portion 126. Again, if compatibility exist between the high K dielectric material and the photoresist or if the interface between the photoresist and the high K dielectric reflects illumination at the UV lithography wavelength, an anti reflective barrier material may be deposited over the first high K dielectric layer 102 prior to depositing the photoresist and fabricating the mask 124.

Figure 6C:
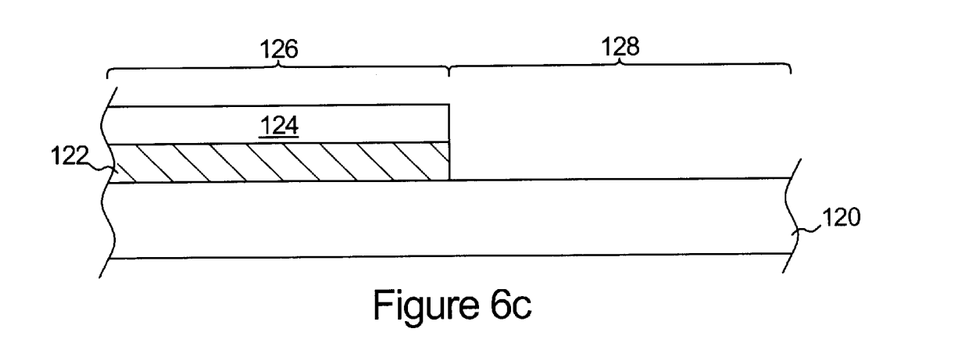
FIG. 6c is a cross sectional view of one processing step in the fabrication of the integrated circuit in accordance with the method of the flowchart of FIG. 3.

Step 62 represents removing the first high K dielectric layer 122 in the second portion 128 to expose the substrate 120 as is shown in FIG. 6c. Removing the high K dielectric may be performed using an etch chemistry of HBr, He, or $CF_4$ in an inert gas environment which is selective between the high K material and polysilicon.

Figure 6D:
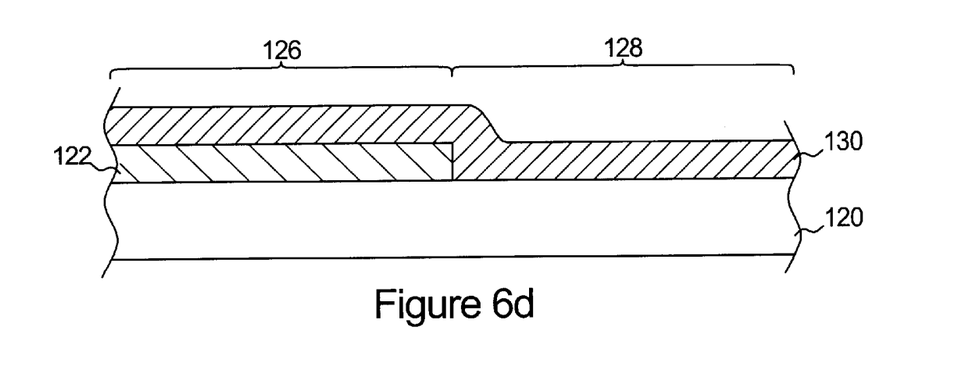
FIG. 6d is a cross sectional view of one processing step in the fabrication of the integrated circuit in accordance with the method of the flowchart of FIG. 3.

Step 64 represents removing the photoresist mask and step 66 represents depositing a second high K dielectric layer 130 over the surface of the first high K dielectric in the first portion 126 and over the exposed substrate 120 in the second portion. Again, because some of the high K materials in the group listed above may form an incompatible boundary with crystalline silicon, a barrier interface layer such as silicon dioxide may be deposited prior to depositing the second high K dielectric layer 130. Again, the buffer interface layer have a thickness of about 0.5 nm to about 0.7 nm and may be deposited using low temperature thermal oxidation, a remote plasma deposition process, an atomic layer deposition process, or a similar process.

Figure 6E:
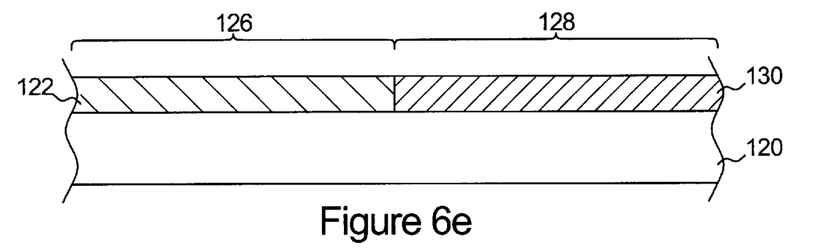
FIG. 6e is a cross sectional view of one processing step in the fabrication of the integrated circuit in accordance with the method of the flowchart of FIG. 3.

Step 68 represents polishing the wafer to level the surface thereby removing the second dielectric layer 130 and exposing the first dielectric layer 122 in the first portion 126 while leaving the second dielectric layer 130 in the second portion 128 as is shown in FIG. 6e.

Figure 6F:
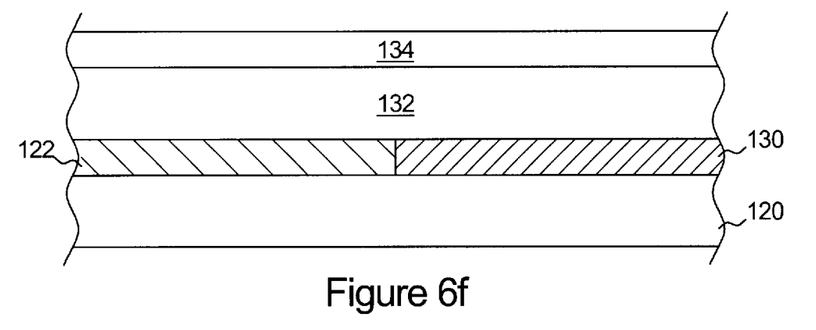
FIG. 6f is a cross sectional view of one processing step in the fabrication of the integrated circuit in accordance with the method of the flowchart of FIG. 3.

Step 70 represents depositing a layer of semiconductor material 132 across both the first dielectric layer 122 and the second dielectric layer 130 and an antireflection coating and a layer of photoresist 134 across the surface of the semiconductor material 132 as is shown in FIG. 6f. The layer of semiconductor material 132 may be polysilicon. Again, because incompatibility may exist between either the material of the first dielectric layer 122 and polysilicon or the material of the second dielectric layer 130 and polysilicon, a barrier interface layer, such as 0.5 nm to 0.7 nm of silicon dioxide, may be deposited on the surface of both the first dielectric layer 122 and the second dielectric layer 130 prior to depositing the polysilicon.

Figure 6G:
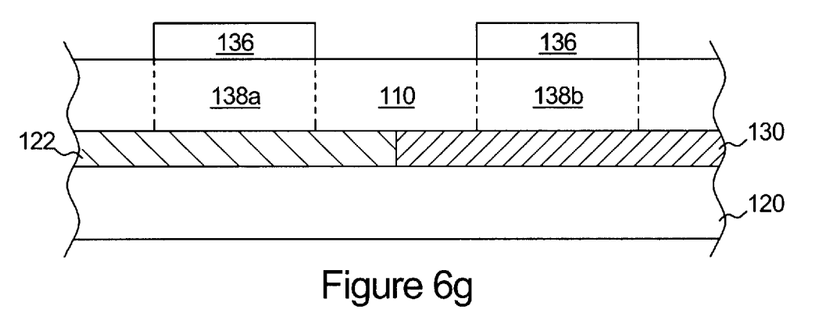
FIG. 6g is a cross sectional view of one processing step in the fabrication of the integrated circuit in accordance with the method of the flowchart of FIG. 3.

Step 72 represents patterning and developing the photoresist to form a photoresist mask 136 on the surface of the polysilicon layer 110. Again, the mask may be patterned using typical lithography techniques which may include exposing the photoresist to patterned coherent UV illumination and developing the photoresist to harden the photoresist mask 136 in gate regions 138a and 138b while washing away the photoresist over other regions.

Step 74 represents etching the polysilicon layer 110 and the dielectric layers 122 and 130 to form the transistor gates 140a and 140b over the first dielectric layer 122 and the second dielectric layer 130 respectively as is shown in FIG. 5h. Etching of the polysilicon may include an ion bombardment etch using HBr, $CF_4$, $CL_2$ in combination with $HeO_2$ to increase the selectivity between the polysilicon and the high K materials. Increasing selectivity between the polysilicon and the high K material enables the polysilicon etch to be performed with an increased bias power and a reduced pressure which improves the vertical side wall tolerance of the gate profile. Etching of the high K dielectrics may be performed using an etch chemistry of HBr, He, or $CF_4$ in the environment which is selective between the high K material and polysilicon. As such, the etching of the high K dielectrics does not significantly effect the sidewall profile of the gates 140a and 140b and does not significantly penetrate into the polysilicon substrate 120.

Figure 6H:
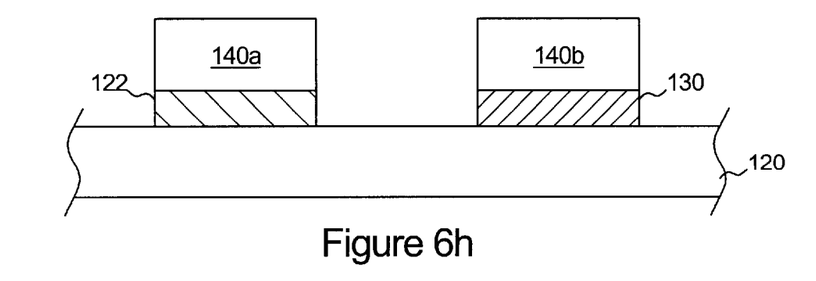
FIG. 6h is a cross sectional view of one processing step in the fabrication of the integrated circuit in accordance with the method of the flowchart of FIG. 3.

Step 76 represents removing the gate mask and step 78 represents implanting the source and drain and forming insulating side wall spacers.

Figure 4:
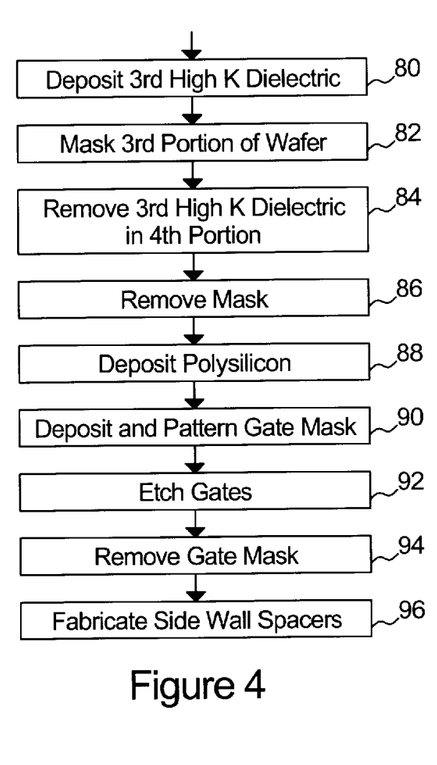
FIG. 4 is a flow chart representing a method of fabricating an integrated circuit in accordance with one embodiment of the present invention.

Turning to the flowchart of FIG. 4 and the cross section diagrams of FIGS. 7a through 7f, yet a second alternative process for fabricating an integrated circuit in accordance with the present invention is shown. The method of the flow chart of FIG. 4 includes steps 58 through 68 of the flowchart of FIG. 3 as the first steps of this second alternative process. The description of such steps will not be repeated for brevity. Following step 68 in this second alternative process, step 80 represents depositing a third dielectric layer 142 on the surface of the exposed first dielectric layer 122 and the second dielectric layer 130. The third dielectric layer may be deposited using low pressure chemical vapor deposition and may comprise a material selected from the group of $HfO_2$, $ZrO_2$, $CeO_2$, $Al_2O_3$, $TiO_2$, $Y_2O_3$, and other binary and tertiary metal oxides and ferroelectric material having a dielectric constant greater than 20.

Step 82 represents fabricating a mask 146 over a third portion 146 of the third dielectric layer 142. The third portion is may or may not correspond to the first portion 126 or the second portion 128 (FIGS. 6b–6d). The mask 146 may be a photoresist mask fabricated using typical lithography techniques which may include depositing photoresist across the entire surface of the third high K dielectric layer 142 followed by patterning the photoresist using coherent UV illumination and developing the photoresist to wash away the photoresist over a fourth portion 148 of the third high K dielectric layer 142 while leaving the mask 146 over the third portion 144. Again, if compatibility exist between the high K dielectric material and the photoresist or if the interface between the photoresist and the high K dielectric reflects illumination at the UV lithography wavelength, an anti reflective barrier material may be deposited over the first high K dielectric layer 122 and the second high K dielectric layer 130 prior to depositing the photoresist and fabricating the mask 146.

Figure 7A:
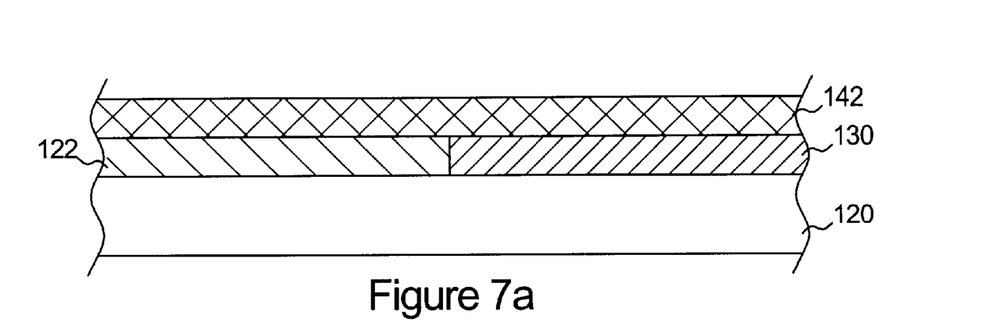
FIG. 7a is a cross sectional view of one processing step in the fabrication of the integrated circuit in accordance with the method of the flowchart of FIG. 4.
Figure 7B:
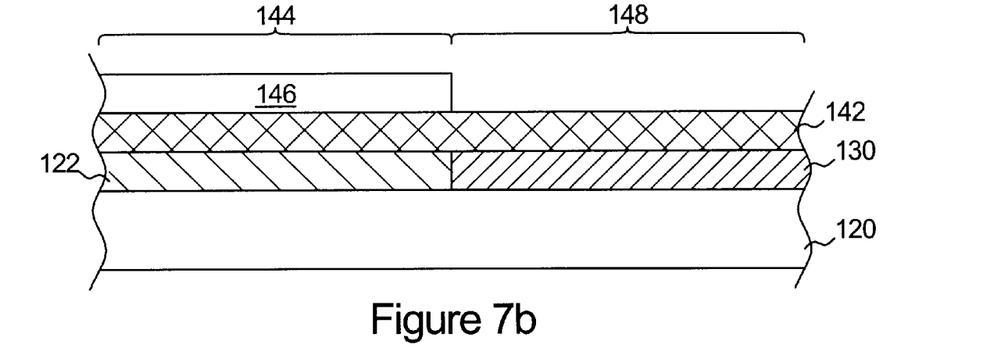
FIG. 7b is a cross sectional view of one processing step in the fabrication of the integrated circuit in accordance with the method of the flowchart of FIG. 4.
Figure 7C:
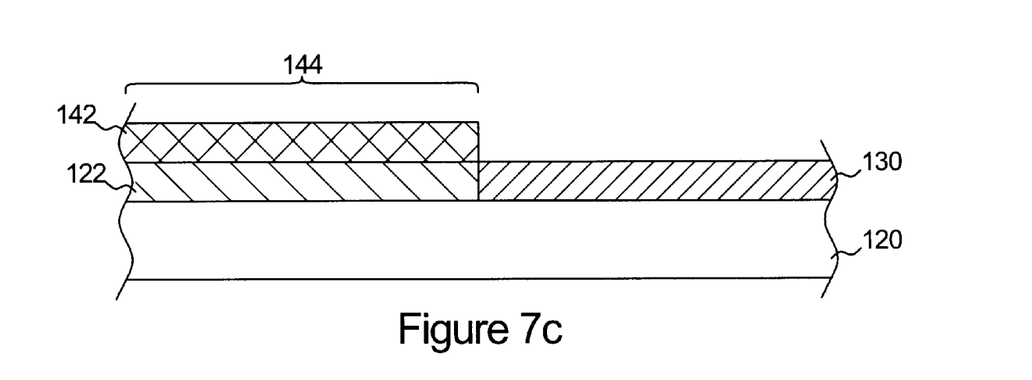
FIG. 7c is a cross sectional view of one processing step in the fabrication of the integrated circuit in accordance with the method of the flowchart of FIG. 4.

Step 84 represents removing the third high K dielectric layer 142 in the fourth portion as is shown in FIG. 7c. Removing the third high K dielectric layer 142 may be performed using an etch chemistry selective between the third high K dielectric layer 142 and the second high K dielectric layer 130. Step 86 represents removing the mask to expose the surface of the third high K dielectric layer 142 in the third portion 144 as is shown in FIG. 7c.

Figure 7D:
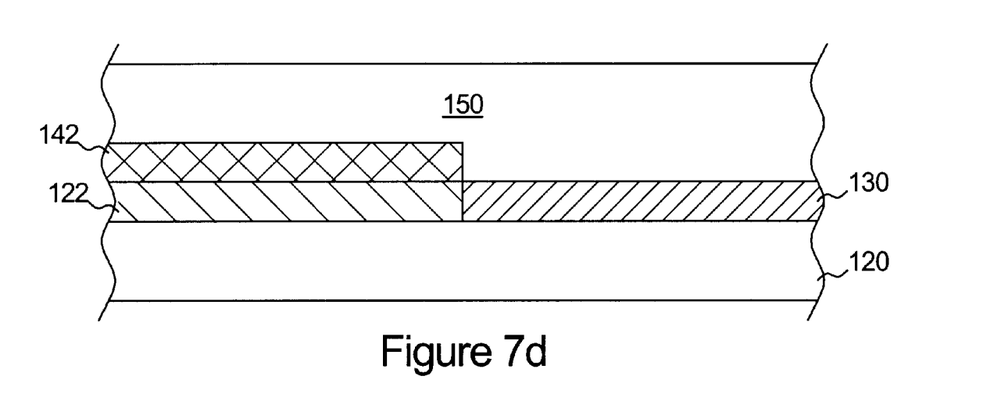
FIG. 7d is a cross sectional view of one processing step in the fabrication of the integrated circuit in accordance with the method of the flowchart of FIG. 4.

Step 88 represents depositing a polysilicon layer 150 over the surface of the third high K dielectric layer 142 in the third portion and over the second high K dielectric layer 130 in the fourth portion as is shown as is shown in FIG. 7d.

Figure 7E:
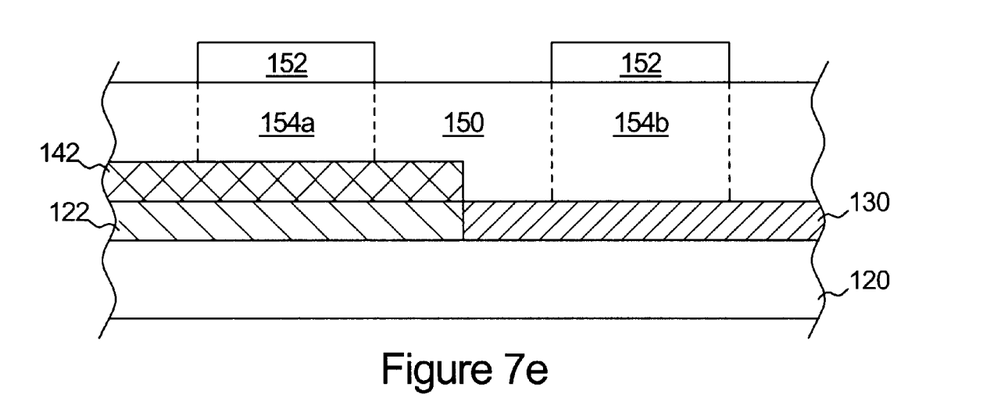
FIG. 7e is a cross sectional view of one processing step in the fabrication of the integrated circuit in accordance with the method of the flowchart of FIG. 4.

Step 90 represents depositing and patterning a photoresist mask 152 on the surface of the polysilicon layer 150. Again, the mask may be a photoresist mask fabricating using typical lithography techniques which may include depositing an antireflective coating such as nitride across the entire surface of the polysilicon layer 150 followed depositing a layer of photoresist across the entire surface of the anti reflective coating. The photoresist may then be patterned using coherent UV illumination and developing the photoresist to harden the photoresist mask 152 in gate regions 154a and 154b while washing away the photoresist over other regions.

Step 92 represents etching the polysilicon layer 150 and the dielectric layers 122, 142, and 130 to form the transistor gates 156a and 156b over the third dielectric layer 142 and the second dielectric layer 130 respectively as is shown in FIG. 6f. Again, etching of the polysilicon may include an ion bombardment etch using HBr, $CF_4$, $CL_2$ in combination with $HeO_2$ to increase the selectivity between the polysilicon and the high K materials. Etching of the high K dielectrics may be performed using an etch chemistry of HBr, He, or $CF_4$ in the environment which is selective between the high K material and polysilicon.

Figure 7F:
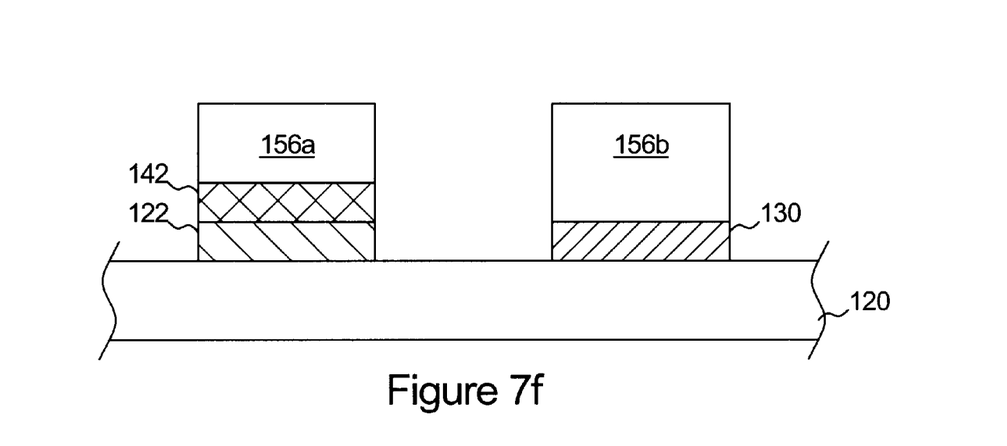
FIG. 7f is a cross sectional view of one processing step in the fabrication of the integrated circuit in accordance with the method of the flowchart of FIG. 4.

Step 94 represents removing the photoresist mask and step 96 represents implanting the source and drain and fabricating side wall spacers.

In summary, the integrated circuit with a plurality of transistors, each of which may have a gate dielectric with properties independent of the gate dielectric for adjacent transistors provides for the ability to fabricate more complex circuits on a semiconductor substrate. The methods of fabricating such an integrated circuit structures further enhance the flexibility of integrated circuit design. Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. An integrated circuit fabricated on a semiconductor substrate comprising:
   a first field effect transistor comprising a first polysilicon gate positioned above a first channel region of the substrate and isolated from the first channel region by a first dielectric layer comprising a first dielectric material selected from the group of materials consisting of $TiO_2$, $Y_2O_3$, $Ta_2O_5$, $La_2O_3$, their silicates or aluminates, $BaTiO_3$, $SrTiO_3$, BST ($(Ba,Sr)TiO_3$), $PbTiO_3$, PZT, $HfO_2$, $ZrO_2$, $CeO_2$, $Al_2O_3$, $TiO_2$, $Y_2O_3$, and tertiary metal oxides and ferroelectric material having a dielectric constant greater than 20, the first dielectric layer extending across the entire length of the first channel region; and
   a second field effect transistor comprising a second polysilicon gate positioned above a second channel region of the substrate and isolated from the second channel region by a second dielectric layer comprising the first dielectric material implanted with at least one of $N^+$, $Hf^+$, $Al^+$, and $Zr^+$, the second dielectric layer extending across the entire length of the second channel region.

2. The integrated circuit of claim 1, further comprising:
   a third dielectric layer extending across the entire length of the second channel region and adjacent to the second dielectric layer; and
   wherein a thickness between the second channel region and the second polysilicon gate is greater than a thickness between the first channel region and the first polysilicon gate.

3. The integrated circuit of claim 2, wherein the third dielectric layer is positioned between the second dielectric layer and the second polysilicon gate.

4. The integrated circuit of claim 3, wherein a thickness of the first polysilicon gate is greater than a thickness of the second polysilicon gate by a thickness of the third dielectric layer.

* * * * *